(12) United States Patent
Perry et al.

(10) Patent No.: US 7,187,247 B2
(45) Date of Patent: Mar. 6, 2007

(54) VARIABLE CAPACITANCE CIRCUIT ARRANGEMENT

(75) Inventors: Colin Leslie Perry, Swindon (GB); Stephen John Parry, Swindon (GB); Alessandro F. Deidda, Midglamorgan (GB); Christopher R. Shepherd, Swindon (GB)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 10/989,896

(22) Filed: Nov. 16, 2004

(65) Prior Publication Data

US 2005/0128008 A1   Jun. 16, 2005

(30) Foreign Application Priority Data

Nov. 24, 2003   (GB) ................. 0327285.3

(51) Int. Cl.
*H03B 5/18* (2006.01)
(52) U.S. Cl. ............... 331/177 V; 331/23; 331/36 C
(58) Field of Classification Search ............ 331/177 V, 331/117 R, 36 C
See application file for complete search history.

(56) References Cited

U.S. PATENT DOCUMENTS

| | | | |
|---|---|---|---|
| 5,327,106 A * | 7/1994 | Sanders ................. | 331/109 |
| 5,670,912 A | 9/1997 | Zocher | |
| 5,859,558 A | 1/1999 | Chen et al. | |
| 5,892,400 A | 4/1999 | Van Saders et al. | |
| 6,111,464 A | 8/2000 | Laureanti | |
| 6,255,910 B1 | 7/2001 | Forstner | |
| 6,396,356 B1 | 5/2002 | Mehta et al. | |
| 6,833,769 B2 * | 12/2004 | Seppinen et al. ....... | 331/177 V |
| 2002/0008585 A1 * | 1/2002 | Welland ................. | 331/2 |
| 2002/0089387 A1 * | 7/2002 | Grewing et al. ........ | 331/177 V |
| 2005/0030116 A1 * | 2/2005 | Takagi ................... | 331/177 V |

FOREIGN PATENT DOCUMENTS

| | | |
|---|---|---|
| GB | 1095605 | 12/1967 |
| GB | 2338128 | 12/1999 |
| GB | 2 384 125 A | 7/2003 |
| GB | 2 386 775 A | 9/2003 |
| GB | 0323021.6 | 11/2003 |
| GB | 0327284.6 | 12/2003 |
| JP | 57210715 | 6/1981 |
| JP | 61258508 | 5/1985 |
| JP | 08340214 | 6/1995 |
| JP | 2001352218 | 6/2000 |

* cited by examiner

*Primary Examiner*—Joseph Chang
(74) *Attorney, Agent, or Firm*—Blakely, Sokoloff, Taylor & Zafman LLP (57) ABSTRACT

A variable capacitance network is disclosed, comprising a plurality of capacitance arms connected in parallel with each other between first and second terminals of the network. Each capacitance arm has a varactor and a series capacitor in series with the varactor A control input applies a common control signal to the junctions between the varactors and their associated series capacitors, to allow for simultaneous control of each varactor.

25 Claims, 5 Drawing Sheets

VARIABLE CAPACITANCE CIRCUIT ARRANGEMENT

CROSS-REFERENCE TO RELATED APPLICATIONS

The present application claims priority to currently pending United Kingdom Patent Application number 0327285.3, filed Nov. 24, 2003.

STATEMENT REGARDING FEDERALLY SPONSORED RESEARCH OR DEVELOPMENT

N/A

BACKGROUND OF THE INVENTION

Varactors are commonly used in RF circuits for tuning oscillators, filters and amplifiers.

Figure 1A:
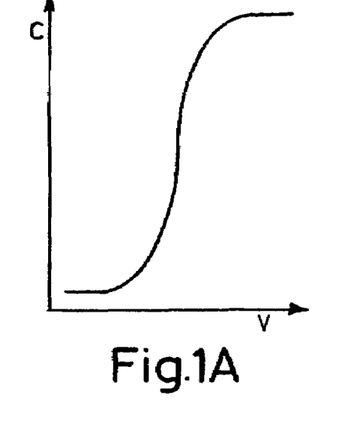
FIG. 1A is a graph illustrating a typical capacitance/voltage (C/V) characteristic of a varactor.
Figure 1B:
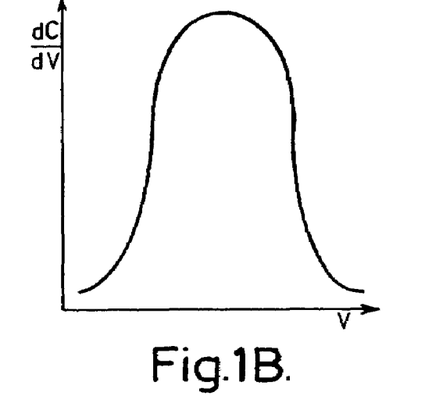
FIG. 1B is a graph illustrating the first derivative (dC/dV) of the characteristic of FIG. 1A.

One problem with varactors is that their capacitance/voltage characteristics are typically very non-linear as shown in FIG. 1A, which illustrates a typical metal oxide semiconductor varactor (MOSvar) capacitance/voltage characteristic. The non-linear feature of the MOSvar is emphasized by FIG. 1B which shows the first derivative dC/dV of the curve of FIG. 1A.

One device allowing a capacitance/voltage characteristic having an acceptable tuning range and a more linear range to be obtained is a hyper-abrupt varactor. However, the implementation of a hyper-abrupt varactor requires extra processing during manufacture, which is expensive.

An alternative method of overcoming the non-linearity of a varactor is to use digital techniques to switch in capacitors so as to tune over the required range. However, this solution is complex, can be physically large, and may be too slow.

In a co-pending patent application filed by the present applicants and having the same priority date as the present application, priority being claimed from GB 0327284.6, there is disclosed a circuit arrangement having a variable capacitance for a tuning circuit, the arrangement comprising a plurality of variable capacitance elements, preferably varactors, connected in parallel. Coupled to the varactors are control means for electronically controlling the capacitances of the varactors, the control means having a control range (e.g. a control voltage range) over which they cause the capacitance of the circuit arrangement to vary. The control means and the varactors are configured such that at least one of the variable capacitance elements exhibits variation of its capacitance in response to the control means over only a portion of the control range. Such an arrangement can be used to provide a more linear capacitance response with respect to a control variable, or a response which more closely follows a required non-linear characteristic, than is generally obtainable with a single varactor.

Figures 8A, 8B:
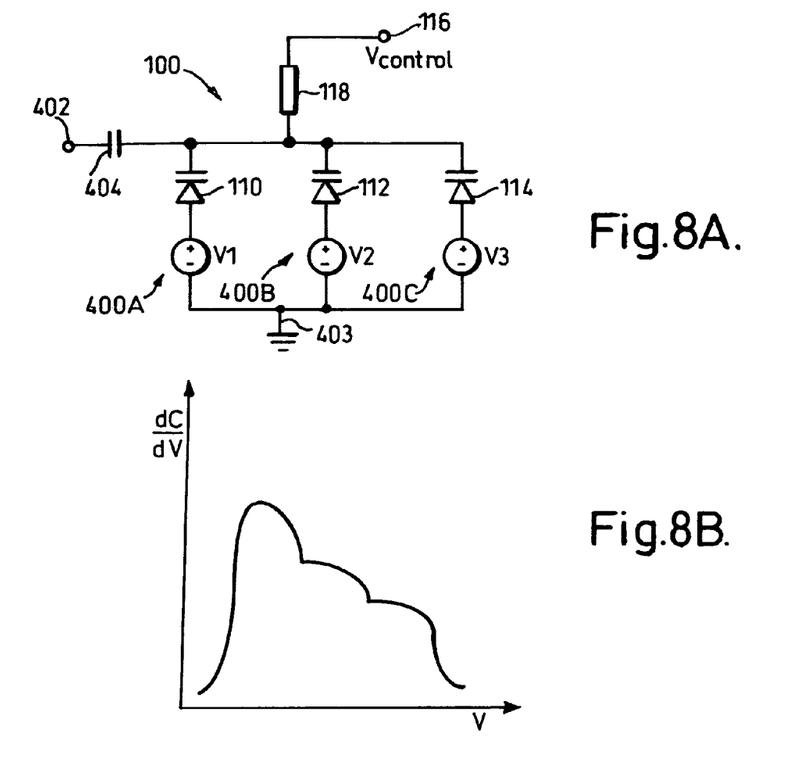
FIG. 8A is a schematic diagram of the circuit arrangement of FIG. 2 with a coupling capacitor connecting a plurality of varactors to a terminal of the network.
FIG. 8B is a graph illustrating a C/V characteristic of the circuit arrangement of FIG. 8A.

Indeed, the preferred arrangement provides a different offset for each varactor in a group of varactors so that variation in the overall capacitance of the arrangement is caused by variation of the capacitances of the varactors in respective consecutive voltage ranges of a common control voltage. In some implementations of the circuit arrangement, e.g. in a voltage controlled oscillator (VCO), it is necessary to add a fixed value capacitor in series with the parallel-connected varactors, e.g. to set the center frequency of a VCO. The addition of the series capacitor can have the effect of modifying the capacitive response of the arrangement to the extent that the required approximately linear capacitance versus control variable response, or linear frequency versus control variable response is no longer obtained. This effect is of particular significance when the capacitance of the series capacitor is smaller than the capacitance of the varactors, and can result in the capacitance characteristic being comparatively steep over an initial portion of the control range, e.g. when one of the varactors is at a mid-point of its variable capacitance range and the others are each set at the low end of their capacitance ranges. In other words, the series capacitor can result in variation of the capacitance of a first varactor producing a large dC/dV value which decreases as the other varactors are brought into operation. This is illustrated in FIG. 8B.

OBJECTS AND SUMMARY OF THE INVENTION

According to a first aspect of the present invention, a variable capacitance network comprises: a plurality of capacitance arms connected in parallel with each other between first and second terminals of the network, each capacitance arm comprising a respective varactor and an associated series capacitor in series with the varactor; and control input means coupled to the junctions between the varactors and their associated series capacitors, and arranged to apply a common control signal to the varactors.

One side of each of the series capacitors may be connected to the first terminal and the other side to its associated varactor, the control input means comprising individual control voltage lines each coupled to a respective one of the junctions between the varactors and the associated series capacitors. In general, the control voltage lines each contains a respective series impedance coupling the respective junction to a common control input.

The network typically includes control means having a control voltage range, the control means causing the capacitance between the first and second terminals to vary by, for instance, application of a common control voltage to the series impedances referred to above and different offset voltages applied to the individual varactors such that at least one of the varactors exhibits a complete variation in its capacitance over only a portion of the control range of the control means. The network may be such that each varactor exhibits a complete variation of its capacitance in response to the control means over only a respective portion of the control voltage range, the portions overlapping each other within the control voltage range so that, as the control voltage is increased over the control voltage range, the individual varactors are successively brought into their variable capacitance region of operation.

Accordingly, the characteristics of the varactors and the offset voltages determine the way in which the capacitance of the network varies in response to the control means. For example, the variable capacitance elements may be chosen so as to produce a capacitance versus control voltage response which is more linear over its operating range compared with that of a single varactor. Similarly, the variable capacitance elements may be chosen so as to produce a capacitance response which follows an approximate square law characteristic, for a linearized frequency/voltage response when used in conjunction with an inductor to form a resonant network.

The number of series capacitors is preferably equal to the number of varactors in the network.

In one embodiment the capacitors all have the same value.

In another embodiment, the values of the series capacitors are unequal. In particular, they may be weighted so that, as the control voltage increases, capacitance arms having progressively increasing series coupling capacitance are successively brought into the variable capacitance parts of their characteristics so as to produce a flatter overall dC/dV characteristic.

Accordingly, by selecting the value of each of the series coupling the response of the network to the control voltage can be optimized to obtain a response closer to a required ideal response. In the case of the values of capacitance of the series capacitors being weighed, the series capacitance value determines how effectively the corresponding varactor is coupled to an external circuit connected across the first and second terminals. For example, in a network having three series capacitors and three varactors, the capacitors may be weighted so their capacitance values have ratios of 0.8:1:1.2 in the order of activation of the varactors (i.e. the order in which they are brought into the variable capacitance regions of their capacitance-versus-voltage characteristics). It follows that the first varactor is not as well coupled to the external circuit as the second and third varactors.

The network may be provided with a clamping circuit such that each varactor is operated over a limited voltage range.

As stated above, the control means may comprise a common control source and a plurality of different respective offset biases sources. Consequently, a common control voltage and a plurality of different DC offset voltages are applied to the respective varactors. The voltage applied across each varactor is, therefore, the difference between the common control voltage and the respective offset voltage (or the sum of these two voltages, depending on the sign of the offset voltage). Then tuning, the varactor only exhibits a change in its capacitance if the difference between the control voltage and the respective offset voltage falls within the range of voltages over which the varactor capacitance varies, in terms of the voltage applied across the varactor itself. Alternatively, the control means may be configured to apply a plurality of different control voltages to the respective varactors. Common bias voltage may then be applied.

Each varactor may be arranged to have one of its electrodes coupled to the common control voltage source and its other electrode to a respective DC offset bias voltage source.

The capacitance characteristic of the network is dependent on the number of variable capacitive elements connected in parallel. The more variable capacitive elements used in the circuit, the closer the capacitance characteristic can be to a required response i.e. linear, square law, etc.

Advantageously, the control means are arranged such that the variable capacitance parts responses of the variable capacitive elements overlap. By adjustment of the overlaps, it is possible to alter the overall characteristic of the circuit arrangement to be closer to the required characteristic.

The variable capacitance elements are preferably selected such that the sum of their maximum individual capacitance values is equal to the required total maximum capacitance of the circuit arrangement. Additionally, the varactors may be selected such that the combination of the ranges over which their individual capacitances vary is substantially equal to the required total operational range of the network.

The capacitance elements are preferably selected such that the resultant capacitance/voltage characteristic has a square law characteristic or approximate square law characteristic. In this embodiment the characteristic of each capacitance element may be different from the characteristics of the other capacitance elements.

Where, instead, a generally linear capacitance/voltage characteristic is required, the individual variable capacitance elements may be chosen such that the maximum capacitance of each element is approximately equal to the maximum required capacitance of the network divided by the number of parallel variable capacitive elements. In addition, the individual variable capacitive elements may be chosen such that the range over which each of their individual capacitances vary is equal to the total operating range of the network divided by the number of capacitive elements connected in parallel. For example, if there are three variable capacitive elements in the network, the characteristics of the capacitive elements are such that their individual maximum capacitances are each equal to a third of the total capacitance of the network and their effective operating ranges are each approximately a third of the total operating range of the network.

Other capacitance/voltage characteristics or laws may be produced by selection of individual varactor characteristics, coupling capacitor values, and/or individual bias voltages.

According to a second aspect of the present invention, a tunable radio frequency (RF) circuit comprises a circuit arrangement having a variable tuning capacitance, wherein the circuit arrangement comprises a plurality of tuning varactors connected in parallel, and coupled to the tuning varactors, control means arranged to apply a common control signal to each varactor for electronically controlling the capacitances of the varactors, and one or more inductors, the control means having a control range over which they cause the capacitance of the circuit arrangement to vary, and wherein the varactors each have a respective fixed capacitor connected in series with it, the resulting series combination being coupled to the inductor or one of the inductors, the control means being coupled to the nodes between the varactors and their respective fixed capacitors.

In one embodiment, the circuit includes a modulator which comprises a modulation varactor arranged in parallel with the tuning varactors but isolated therefrom by a DC blocking capacitor, the modulation varactor being coupled to a modulation input. The modulation varactor may have an offset voltage applied to one of its electrodes by a modulation bias voltage source.

According to another aspect of the present invention, there is provided a voltage controllable oscillator comprising: an inductance; a plurality of tuning circuit arms connected in parallel with each other across the inductance, each tuning circuit arm comprising a respective varactor and an associated series capacitor in series with the varactor; and control input means coupled to the junctions between the varactors and their associated series capacitors and arranged to apply a common control signal to each varactor. Tuning control means are preferably provided which electronically vary the capacitances of the varactors by applying a varying voltage to the control input means over a control voltage range, the tuning control means and the varactors being configured such that at least one of the varactors exhibits variation of its capacitance in response to the control means over only a portion of the control voltage range.

The tuning control means preferably comprises a plurality of voltage sources arranged to apply to each varactor a voltage $V_{ci}$ where $V_{ci}=V_c-V_i$, $V_c$ being a variable control voltage and $V_i$ being a bias voltage for each respective varactor $_i$, the value of $V_i$ being different for the different varactors.

The varactors, the series capacitors, and the control means are preferably configured to yield an approximately linear frequency versus control voltage response.

The oscillator may include a modulator circuit arm connected in parallel with the tuning circuit arms and across the inductance, the modulator circuit arm comprising a modulation varactor and an associated series capacitor in series with the varactor, and modulation input means coupled to the junction of the modulation varactor and its associated series capacitor.

Additional objects and advantages of the invention will be set forth in part in the description that follows, and in part will be obvious from the description, or may be learned by practice of the invention. The objects and advantages of the invention may be realized and attained by means of the instrumentalities and combinations particularly pointed out in the appended claims.

The accompanying drawings, which are incorporated in and constitute a part of this specification, illustrate at least one presently preferred embodiment of the invention as well as some alternative embodiments. These drawings, together with the description, serve to explain the principles of the invention but by no means are intended to be exhaustive of all of the possible manifestations of the invention.

DETAILED DESCRIPTION OF THE PREFERRED EMBODIMENTS

Reference now will be made in detail to the presently preferred embodiments of the invention, one or more examples of which are illustrated in the accompanying drawings. Each example is provided by way of explanation of the invention, which is not restricted to the specifics of the examples. In fact, it will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents. The same numerals are assigned to the same components throughout the drawings and description.

Figure 2:
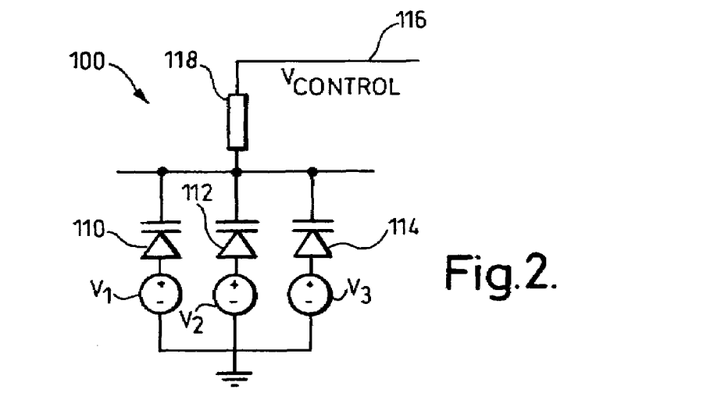
FIG. 2 is a schematic diagram of a circuit arrangement with a linearized response.

Referring to FIG. 2, a variable capacitance circuit arrangement 100 has a variable capacitance formed by three varactors 110, 112, 114 which are connected in parallel. The varactors 110, 112, 114 are each connected at one of their electrodes to a respective DC offset voltage source V1, V2, V3 and, at the other electrode, to a common control input 116 for supplying a control voltage $V_{control}$ via a series impedance 118. In this embodiment each of the offset voltage sources V1, V2, V3 is connected in series between the anode of the respective varactor and one of the supply rails of the, arrangement, in this case to ground, the varactor cathodes being coupled to the control input. The DC offset voltage sources V1, V2, V3 each have a different offset voltage level such that each of the varactors 110, 112, 114 contributes to the variation in overall capacitance only when the difference between the control voltage and the respective offset bias voltage falls within the voltage range (in terms of the voltage across the varactor) over which the varactor exhibits a variation in capacitance.

In this embodiment, the different offset voltages V1, V2, and V3 are such that V1 is smaller than V2 which is, in turn, smaller than V3. Therefore, assuming that the individual characteristics of the varactors are similar, if the control voltage is raised progressively from the lower limit of its range to its upper limit, the operation of the circuit 100 will sequentially bring the first varactor 110 into the variable part of its characteristic, followed by the second varactor 112, and finally the third varactor 114.

The different offset voltage levels may be achieved by a number of different arrangements, as would be known by a person of ordinary skill in the art. These arrangements can include the use of a voltage divider circuit, zener diodes, individual DC power sources and the like.

The characteristics of the varactors 110, 112, 114 are selected such that the sum of their maximum respective capacitances is equal to the required total maximum capacitance of the circuit arrangement 100. In addition, the varactor characteristics are selected such that the sum of the maximum ranges of variation in capacitance of the varactors is equal to the required total variation in capacitance of the circuit arrangement 100. If a substantially linear variation of the overall capacitance with control voltage is required, the varactors are selected so as to have the same or generally similar characteristics, at least insofar as they have at least approximately equal capacitance ranges and capacitance-versus-voltage slopes. If the overall capacitance is to follow an approximate square law characteristic with respect to voltage, as may be required to achieve a linearized tuning frequency-versus-voltage characteristic in a resonant inductance/capacitance circuit such as in an. RF voltage-controlled oscillator (VCO), the varactors 110, 112, 114 may be selected to have different capacitance ranges. For instance, the varactor associated with the highest offset voltage may be chosen to have a greater range of variation of capacitance and a steeper capacitance-versus-voltage slope.

Figure 3:
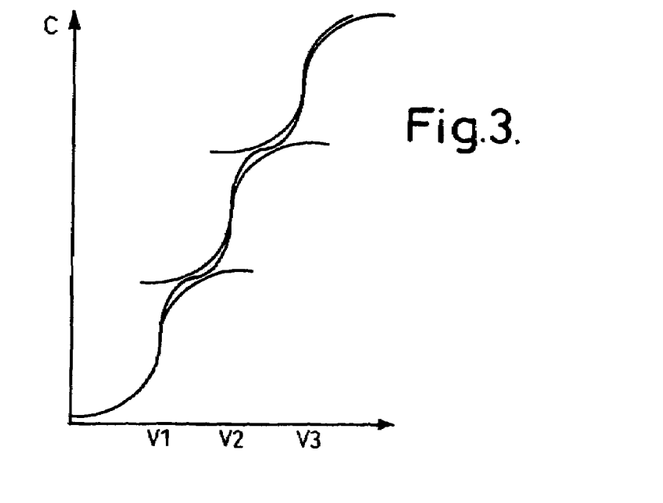
FIG. 3 is a graph illustrating a C/V characteristic of the circuit arrangement of FIG. 2.

The offset voltages applied to the varactors are preferably set such that there is an overlap, with respect to control voltage, between the high capacitance part of the variable capacitance range of one varactor and the low capacitance part of the range of capacitance of another of the varactors. Overlapping of the variable portions of respective characteristics in this way, as depicted in FIG. 3, contributes to the linearity of the capacitance/voltage characteristics of the composite arrangement 100.

The circuit arrangement 100 is operable such that as the control voltage is increased from a minimum to a maximum voltage, each of the varactors is sequentially operated. That is to say, as the control voltage is increased the varactors are activated such that there is an overlap between the high capacitance part of the capacitance variation range of one varactor and the low capacitance part of the range of capacitance variation of another of the varactors. The total capacitance of the circuit arrangement 100 is equivalent to the sum of the capacitance of each of the varactors.

Figure 4:
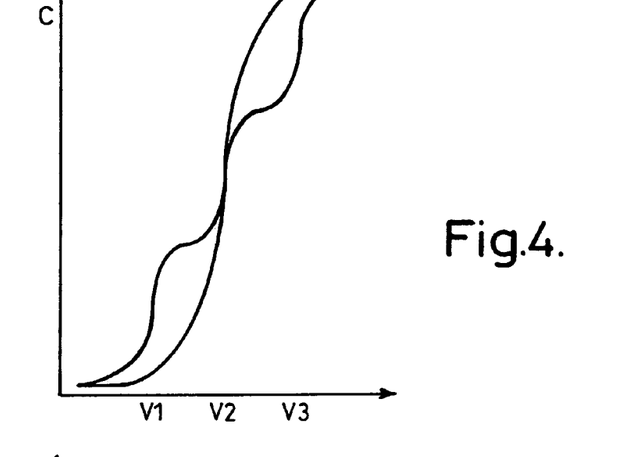
FIG. 4 is a graph illustrating the C/V characteristics shown in FIGS. 1A and 3 in a single representation.

FIG. 4 shows the capacitance versus voltage characteristic of the circuit arrangement 100 of FIG. 2 superimposed on the equivalent curve of a circuit having a typical single MOSvar, as shown in FIG. 1A. It can be seen that the curve of the circuit arrangement 100 is more linear than that of the single MOSvar. This fact is more clearly seen in FIG. 5 which illustrates the first derivative dC/dV of the characteristic of FIG. 3. It can be see that the circuit arrangement 100 produces less variation in the dC/dV characteristic over the operational control voltage range compared with that of the dC/dV characteristic of the typical MOSvar, as evidenced by the approximately flat character of the relevant part of the curve.

To summarize, the circuit arrangement 100 has a capacitive network made up of a number of varactors connected in parallel, each varactor being inherently non-linear over its operating range, and yet the network as a whole has the advantage of a more linear capacitance versus control input response compared to that of the typical single varactor implementation capable of capacitance variation over the same range.

The circuit arrangement 100 has many different applications. However, it is of particular benefit in RF tuning circuits such as voltage controlled oscillators, filters and tuned amplifiers.

Figure 6:
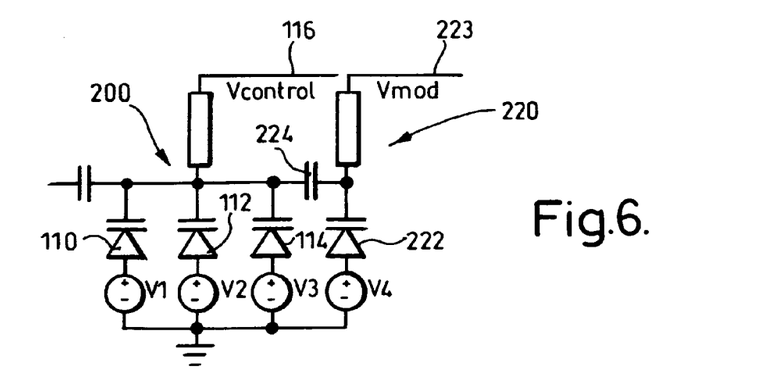
FIG. 6 is a schematic diagram of a circuit arrangement similar to that of FIG. 2, including a modulator.

Referring now to FIG. 6 of the drawings, the capacitance part of a voltage controlled oscillator VCO 200 in accordance with the invention includes a modulator 220. Tuning of the oscillator is accomplished by a network of parallel varactors coupled to a control input and respective offset sources as described above with reference to FIG. 2. The modulator 220 comprises a varactor 222 connected effectively in parallel with the varactors 110, 112, 114 of the tuning network. The modulator varactor is connected at one of its electrodes to a DC offset bias voltage source V4 and at its other electrode to a modulation input 223 for receiving a modulation signal $V_{mod}$. The varactor 222 is coupled to the circuit arrangement 100 via a DC blocking capacitor 224, thereby isolating the modulation input 223 from the control input 116.

Use of an additional varactor 222 specifically for frequency modulation of the VCO output signal, the modulation being applied to this varactor directly from a modulation input which is isolated from the control input 116, has the advantage that the sensitivity of the modulation process can be set substantially independently of the VCO tuning frequency. That is to say, the variations in capacitance produced by the modulation signal applied to the modulation input 226 do not vary significantly in magnitude for a given modulation voltage amplitude as the VCO operating frequency alters. Accordingly, the depth of modulation remains substantially constant.

Figure 7:
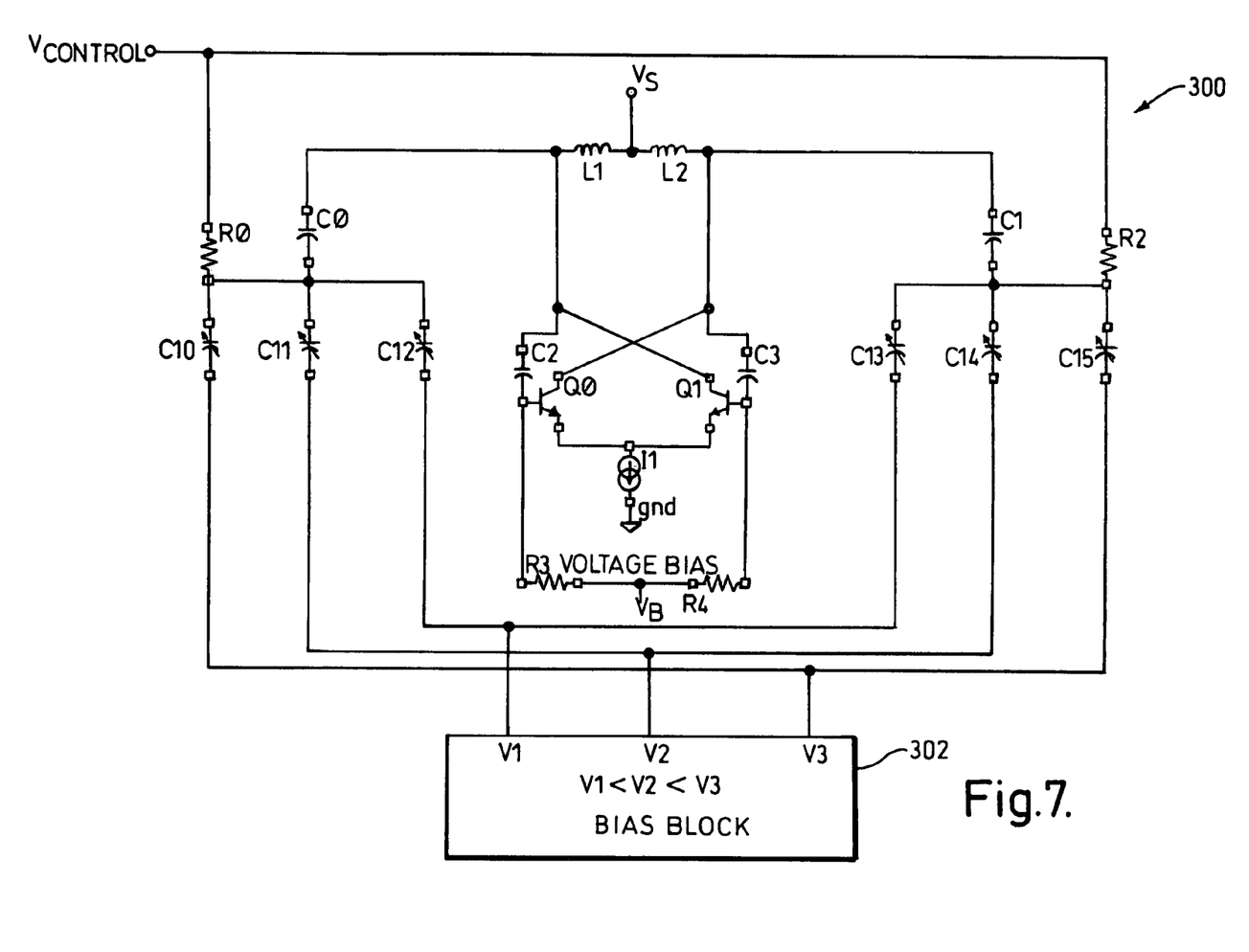
FIG. 7 is a schematic diagram of a voltage controlled oscillator using the principle embodied in the circuit arrangement of FIG. 2.

Referring to FIG. 7, an emitter coupled LC oscillator 300 incorporating variable capacitance circuitry as described above has a cross-coupled transistor pair Q0, Q1 arranged as a voltage controllable oscillator with a differential output across the collectors of the transistors Q0, Q1. The frequency of the oscillator 300 is determined by the inductive and capacitive components connected to the collectors of the cross-coupled transistor pair Q0, Q1 and to the virtual ground formed by a bias block 302, which incorporates a plurality of offset voltage sources producing the varactor bias voltages V1, V2 and V3. In this circuit, the frequency-determining components are inductors L1 and L2, coupling capacitors C0 and C1 and varactors C10, C11, C12, C13, C14 and C15, Each varactor is connected to a respective DC offset voltage source V1, V2 or V3 in the bias block 302 and the total capacitance of the varactors is adjusted by varying the value of the control voltage, $V_{control}$.

Accordingly, the connections between the voltage bias block 302 and the varactors connected to bias voltages sources VI, V2 and V3 can be considered to be an RF ground. Therefore, the varactors C10, C11 and C13, located on the left hand side (LHS) of the circuit, are effectively connected in parallel at radio frequencies. The total capacitance of the frequency-determining components on the LHS of the circuit is the capacitance resulting from the connection of coupling capacitor CO in series with the total capacitance of the parallel-connected varactors C10, C11 and C13. Similarly, the capacitance of the frequency-determining components on the right-hand side (RHS) of the circuit comprises coupling capacitor C1 in series with the parallel combination of the varactors C13, C14 and C15. The total capacitance of the frequency-determining components in the oscillator 300 is equal to the overall capacitance of the frequency-determining capacitances (C1, C13, C14, C15) on the RHS in series with the overall capacitance of the frequency-determining capacitances (C0, C10, C11, C12) on the LHS, The total inductance of the inductive frequency-determining components in the oscillator 300 is equal to the inductance of inductor L1 in series with that of the inductor L2.

The transistors Q0, Q1 are connected at their bases to a bias voltage source $V_B$ via resistors R3 and R4 respectively so as to forward bias their base-emitter junctions.

The transistors Q0, Q1 are capacitively cross-coupled. Specifically, coupling capacitors C2 and C3 couple the signals generated at the collectors of transistors Q1 and Q0 to the bases of the transistors Q0, Q1 respectively to cause oscillation in a well-known manner. The varactor pairs C10, C13; C11, C14; and C12, C15 are selected such that the varactors of each pair have the same C/V characteristic. However, the C/V characteristic of each pair may be selected to have a different characteristic and in particular different capacitance ranges. In a preferred embodiment, the C/V characteristic of the complete set of varactors follows a square law curve in order to achieve a linearized frequency/voltage characteristic for the voltage controllable oscillator. This can be achieved, for example, by use of a varactor associated with the highest offset voltage which has a characteristic having a steeper C/V curve and extends over a larger capacitive range.

Variations are possible. For example, the control means may comprise a plurality of control sources connected to the plurality of variable capacitance elements; or a common offset bias and a plurality of different value control sources connected to the variable capacitance elements. Furthermore, the circuit arrangement 100 may be used for a tunable filter or any other application requiring a linearized variable capacitance.

It will be noted that the VCO of FIG. 7 has series-connected coupling capacitors C0, C1 between each group of varactors C10, C11, C12; C13, C14, C15 and the inductors L1, L2. Referring to a simplified illustration of such an arrangement, as appearing in FIG. 8A, it will be seen that the circuit arrangement comprises a capacitance network having three capacitance arms 400A, 400B, 400C, each containing a varactor 110, 112, 114, the capacitance arms being coupled between first and second terminals 402, 403 of the network with an interposed series capacitor 404. When the network is used in a VCO, the capacitor 404 is selected to bring the center frequency of the oscillator to within a required range. If the capacitance of the series coupling capacitor 404 is large in comparison to the combined capacitance of the varactors 110, 112, 114, the capacitance-versus-voltage characteristic and the derivative (the dC/dV characteristic) may not deviate significantly from the curves shown in FIGS. 3, 4 and 5. However, if the coupling capacitor 404 is not large in comparison with the capacitance of the varactors, the dC/dV characteristic can become skewed, as shown in FIG. 8. As will be seen, the coupling capacitor has the effect of producing a large dC/dV value at low control voltages (when the varactor capacitances are low), and a decreasing value as the control voltage increases over the operational range of the network.

Figure 9:
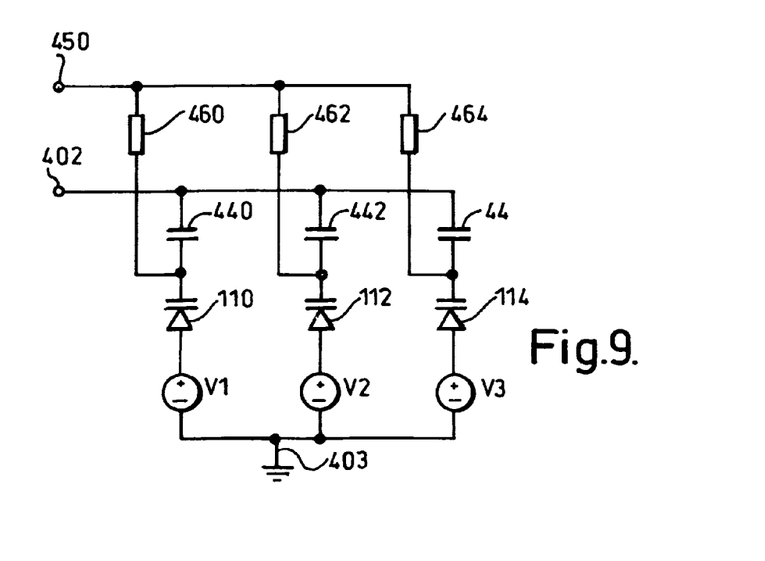
FIG. 9 is a schematic diagram of a capacitance network having a plurality of capacitance arms each comprising a varactor and a series-connected coupling capacitor.

In accordance with the invention, this difficulty can be overcome by a network in which each varactor has a respective series-connected coupling capacitor 440, 442, 444 in the respective capacitance arm, as shown in FIG. 9. These coupling capacitors replace the single coupling capacitor 120 of the network shown in FIG. 8A.

Each of the plurality of coupling capacitors is arranged to couple an individual varactor 110, 112, 114 to the first terminal 402, to which an external circuit or component can be connected.

The capacitances of the varactors 110, 112 and 114 are altered by applying a control voltage $V_{control}$ a control voltage input 450. The network includes control input means comprising a plurality of control lines each including a series resistance 460, 462, 464 and each connecting the control input 450 to the node between the varactor 110, 112, 114 and the series coupling capacitor 440, 442, 444 of a respective capacitance arm. These control input impedance may be inductors instead of resistors.

Figure 5:
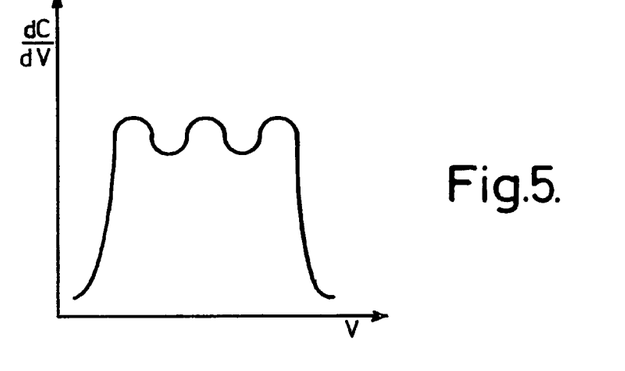
FIG. 5 is a graph illustrating the first derivative (dC/dV) of the capacitance response of the circuit arrangement of FIG. 2.

The fixed value coupling capacitors 440, 442, 444 are used in conjunction with the varactors 110, 112, 114 to set the center frequency of the oscillator, the tuning range of the oscillator being defined by the combined capacitance range of the varactors. The capacitors 440, 442, 444 may all have the same capacitance value in which case an improvement in the frequency-versus-voltage characteristic or the capacitance-versus-voltage characteristics compared to the network with a single coupling capacitor can be achieved. In other words, it is possible to bring the dC/dV characteristic nearer to that shown in FIG. 5B. However, the characteristics can be brought closer still to the ideal characteristic by adopting different values for the coupling capacitors, preferably by weighting or scaling them. Weighting the capacitors determines the degree to which each varactor is coupled to the terminal 402. In the network of FIG. 9, in which there are three coupling capacitors, the capacitors are typically selected to have values in the ratios of 0.8:1:1.2, where the offset voltages V1, V2 and V3 in the respective arms are such that V1 is less than V2, and V2 is less than V3. This means that the values of the coupling capacitors in the respective capacitance arms are successively greater in the order in which the varactors are brought into their variable capacitance regions as the control voltage $V_{control}$ increases. Thus, the varactor 110 is brought into its variable capacitance region before the varactors 112 and 114 and is, therefore, more loosely coupled to the terminal 402 of the network. Similarly, the second varactor 112 is more strongly coupled to the terminal 402 than the first varactor 110, but less strongly coupled than the third varactor 114.

It will be evident, now, how the VCO described above with reference to FIG. 7 may be modified in the event that relatively small coupling capacitors C0 and C1 are needed. Instead of connecting the nodes of each group of three varactors C10, C11, C 12 together directly, each has a respective coupling capacitor connected to the inductor L1, and separate resistors connect the common control input to the respective nodes between the coupling capacitors and the individual varactors. Similarly, coupling capacitor CI is replaced by individual coupling capacitors in series with the varactors of C13, C14, C15 of the second group, each connecting the respective varactor to the inductor L2. Again, the series control input resistance R2 is replaced by separate resistors as described above with reference to the first group of varactors C10, C11, C12. Following the principle outlined above, the coupling capacitors may be weighted such that those connected in the capacitance arms containing the varactors C12, C13 which are biased with the lowest biasing voltage V1 are smaller than the coupling capacitors in the capacitance arms containing the varactors C11, C14 biased with an offset voltage V2, while the coupling capacitors associated with the varactors CIO, C15 associated with the highest bias voltage V3, have the highest capacitance.

Figure 10:
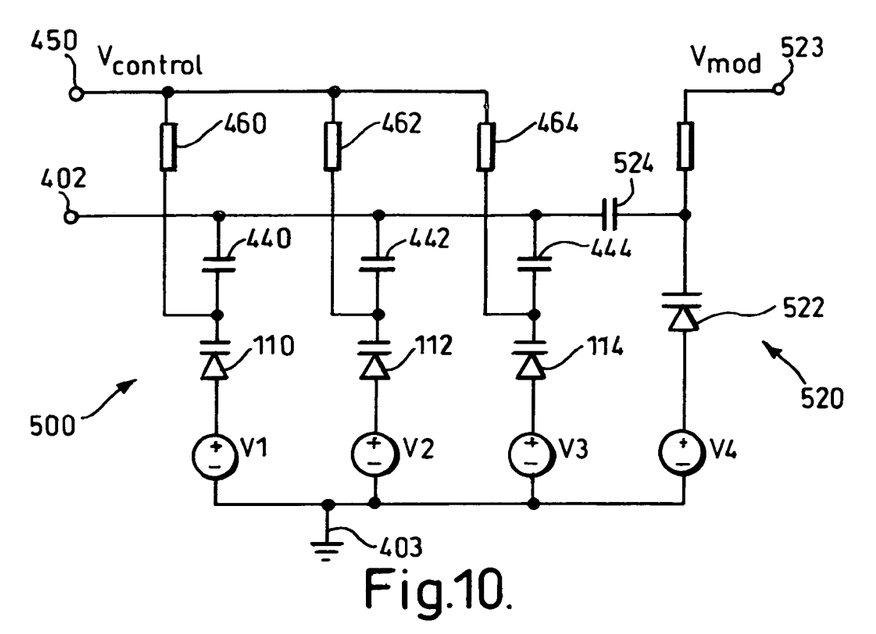
FIG. 10 is a schematic diagram of a circuit arrangement including a capacitance network of FIG. 9 together with a modulator.

Referring now to FIG. 10 of the drawings, the capacitance part of a VCO 500 in accordance with the invention may include a modulator 520. Tuning of the oscillator is accomplished using a tuning network of parallel capacitance arms each coupled to a control input and respective offset sources as described above with reference to FIG. 9. The modulator 520 comprises a modulation varactor 522 connected effectively in parallel with the tuning varactors 110, 112, 114 of the tuning network. The modulation varactor 522 is connected at one of its electrodes, here the anode, to a DC offset bias voltage source having a voltage value V4 and at its other electrode, here the cathode, to a modulation input 523 for receiving a modulation signal $V_{mod}$. The modulation varactor 522 is coupled to the circuit arrangement 400 via a DC blocking capacitor 524, thereby isolating the modulation input 523 from the control input 416 at low frequencies.

Use of an additional varactor 522 specifically for frequency modulation of the VCO output signal, with the modulation being applied to this varactor directly from a modulation input which is isolated from the control input 416, has the advantage that the sensitivity of the modulation process can be set substantially independently of the VCO tuning frequency. That is to say, the variations in capacitance produced by a modulation signal of given amplitude applied to the modulation input 526 do not vary significantly as the VCO operating frequency alters. Accordingly, the depth of modulation remains substantially constant.

Figure 11:
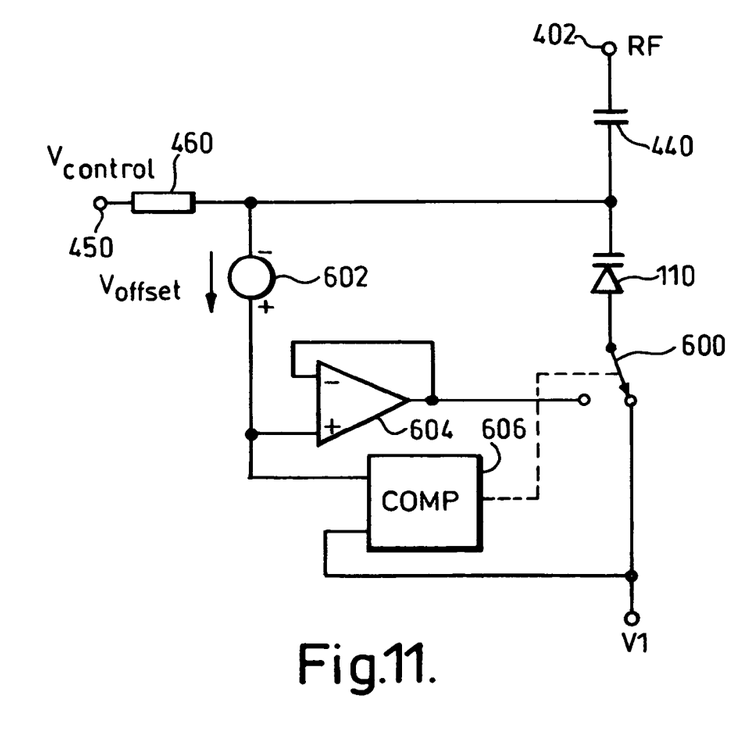
FIG. 11 is a schematic diagram of a capacitance arm for use in the circuitry shown in FIGS. 9 and 10, including a voltage clamping structure.

In some cases, it may be necessary to restrict the range of voltages applied to the varactors in the circuit arrangements described above. Such voltage restriction can be achieved by means of clamping structures applied to the varactors. The circuit illustrated in FIG. 11 is a simplified schematic diagram of one of the capacitance arms of the network of FIG. 9 or that of FIG. 10, together with the associated control input circuitry. To these components there is added a voltage clamp comprising a switch 600 (embodied as an electronic switch in practice) between the varactor 110 and its bias voltage source V1. An offset voltage source 602 having the value $V_{offset}$ is connected between the junction of the varactor 110 and its associated series coupling capacitor 440 and the input of a voltage follower 604, the output of which is also connected to the switch 600. Depending on the state of the switch 600, the varactor 110 is connected either to the bias voltage source V1 or to the output of the voltage follower 604. The voltage on the voltage follower output is equal to $V_{control}+V_{offset}$ where $V_{control}$ is the control voltage applied to the varactor 110 from the control input 450 via resistor 460 and $V_{offset}$, is an offset voltage equivalent to a maximum permitted reverse bias voltage across the varactor 110. The voltage clamp includes a comparator 606 which compares the voltage at the input of the voltage follower 604 (which equals the voltage at the voltage follower output) with the voltage on bias voltage source V1. The comparator 606 has an output which controls the switch 600 according to whether or not the voltage at the input to the voltage follower 604 is above or below the voltage of bias voltage source V1.

The comparator 606 and the switch 600 operate together in such a way that, so long as the control voltage $V_{control}$ drops no lower than VI less the voltage $V_{offset}$, the varactor remains connected to the bias voltage source V1. Once the reverse-bias threshold is crossed, however, the switch changes state and the voltage on the anode of the varactor 110 varies in step with the control voltage $V_{control}$ with a constant reverse-bias voltage equal to the magnitude of the offset voltage $V_{offset}$.

The variable capacitance networks described above have a number of applications. They are of particular benefit in RF tuning circuits such as voltage controlled oscillators, filters and tuned amplifiers.

Variations may be made without departing from the scope of the invention. For example, the control means may comprise a plurality of control sources connected to the plurality of variable capacitance elements; or a common offset bias and a plurality of different value control sources connected to the capacitance elements.

The disclosure of the specification and drawings of our co-pending application mentioned above is explicitly incorporated in the present specification and drawings by reference. That application discloses a circuit arrangement having a variable capacitance for a tuning circuit, wherein the circuit arrangement comprises a plurality of variable capacitance elements connected in parallel and, coupled to the capacitance elements, control means for electronically controlling the capacitances of the variable capacitance elements, the control means having a control range over which they cause the capacitance of the circuit arrangement to vary, the control means and the variable capacitance elements being configured such that at least one of the said elements exhibits variation of its capacitance in response to the control means over only a portion of the control range. In that case, the control means and the variable capacitance elements are configured such that each of the elements exhibits variation of its capacitance in response to the control means over only a respective portion of the control range, the portions overlapping each other within the control range. The control means may be arranged to energize each of the capacitive elements in a sequential manner as the common control voltage increases over the control range.

The co-pending application is also directed to a tunable RF circuit comprising a circuit arrangement having a variable tuning capacitance, wherein the circuit arrangement comprises a plurality of tuning varactors connected in parallel, and coupled to the tuning varactors, control means for electronically controlling the capacitances of the varactors, and one or more inductors, the control means having a control range over which they cause the capacitance of the circuit arrangement to vary, the control means and the varactors being configured such that at least one of the varactors exhibits variation of its capacitance in response to the control means over only a portion of the control range. The circuit arrangement may include a modulator which comprises a modulation varactor arranged in parallel to the tuning varactors, the modulation varactor being coupled to a modulation input. In such a case the modulation varactor preferably has a voltage offset applied to one of its electrodes.

Another aspect of the co-pending application is a VCO comprising a circuit arrangement having a variable capacitance for a tuning circuit, wherein the circuit arrangement comprises a plurality of varactors connected in parallel, and coupled to the varactors, control means for electronically controlling the capacitances of the varactors, the control means having a control range over which they cause the capacitance of the circuit arrangement to vary, the control means and the varactors being configured such that at least one of the varactors exhibits variation of its capacitance in response to the control means over only a portion of the control range. As in the network described above, the circuit arrangement may be arranged to achieve a substantially linear oscillation frequency versus control voltage characteristic by having a generally square law capacitance with respective voltage characteristic.

Yet another aspect of the co-pending application is a tunable radio RF circuit comprising: the resonant combination of a tuning varactor, a modulation varactor and an associated inductance, the tuning varactor and the modulation varactor being respectively coupled to a tuning control input and modulation input which are DC isolated from each other.

A presently preferred embodiment of the present invention is shown in FIG. FIG. 2.

While at least one presently preferred embodiment of the invention has been described using specific terms, such description is for illustrative purposes only, and it is to be understood that changes and variations may be made without departing from the spirit or scope of the following claims.

What is claimed is:

1. A variable capacitance network comprising:
   a plurality of capacitance arms connected in parallel with each other between first and second terminals of the network, each capacitance arm comprising a respective varactor and an associated series capacitor in series with the varactor;
   control input means coupled to the junctions between the varactors and their associated series capacitors, and arranged to apply a common control signal to each varactor; and
   control means having a common control voltage source and a plurality of bias voltage sources, each bias voltage source being connected to a respective one of the varactors whereby each bias voltage source is independently controllable.

2. A network according to claim 1, wherein one side of each of the series capacitors is connected to the first terminal and the other side to its associated varactor, and the control input means comprise individual control voltage lines each coupled to a respective one of the junctions.

3. A network according to claim 2, wherein the control voltage lines each contain a respective series impedance coupling the respective junction to a common control input.

4. A network according to claim 1, including control means having a control voltage range over which they cause the capacitance between the first and second terminals to vary, and wherein the control means and the varactors are configured such that at least one of the varactors exhibits a complete variation in its capacitance over only a portion of the control range.

5. A network according to claim 4, wherein the control means and the varactors are configured such that each varactor exhibits complete variation of its capacitance in response to the control means over only a respective portion of the control voltage range, the portions overlapping each other within the control voltage range.

6. A network according to claim 1, wherein control voltage source and the bias voltage sources are arranged such that the resultant voltage across each varactor is the difference between a voltage applied by the common control source and the voltage of the respective bias source.

7. A network according to claim 1, wherein the series capacitors have different capacitance values.

8. A network according to claim 1, including clamping devices associated with the varactors to limit the operational ranges of the varactors.

9. A network according to claim 4, wherein the control means and the varactors are configured such that each varactor exhibits complete variation of its capacitance in response to the control means over only a respective portion of a control range of the control means.

10. A network according to claim 4, wherein the control means are arranged to drive each of the varactors in a sequential manner as a control voltage produced by the control means increases over the control range.

11. A network according to claim 1, including a modulator circuit arm connected in parallel with the said capacitance arms and comprising a modulation varactor and an associated series capacitor in series with the varactor, and modulation input means coupled to the junction between the modulation varactor and its associated series capacitor.

12. A tunable radio frequency (RF) circuit comprising a circuit arrangement having a variable tuning capacitance, wherein the circuit arrangement comprises a plurality of tuning varactors connected in parallel, and coupled to the tuning varactors, control means arranged to apply a common control signal to each varactor for electronically controlling the capacitances of the varactors, and one or more inductors, the control means having a control range over which they cause the capacitance of the circuit arrangement to vary, and wherein the varactors each have a respective fixed capacitor connected in series with it, the resulting series combination being coupled to the inductor or one of the inductors, the control means being coupled to the nodes between the varactors and their respective fixed capacitors, wherein the control means comprises a common control voltage source and a plurality of different respective offset voltage sources applied to respective ones of the varactors, whereby each offset voltage source is independently controllable.

13. A circuit according to claim 12, wherein the control means and the varactors are configured such that at least one of the varactors exhibits complete variation of its capacitance in response to the control means over only a portion of the control range.

14. A circuit according to claim 12, including a modulator which comprises a modulation varactor arranged in parallel with the tuning varactors but isolated therefrom by a DC blocking capacitor, the modulation varactor being coupled to a modulation input.

15. A circuit according to claim 14, including a bias voltage source coupled to the one of the electrodes of the modulation varactor.

16. A voltage-controllable oscillator comprising: an inductance;
a plurality of tuning circuit arms connected in parallel with each other across the inductance, each tuning circuit arm comprising a respective varactor and an associated series capacitor in series with the varactor;
control input means coupled to the junctions between the varactors and their associated series capacitors, and arranged to apply a common control signal to each varactor; and
control means having a common control voltage source of the varactors and a plurality of respective fixed bias voltage sources of different voltage values whereby each bias voltage source is independently controllable.

17. An oscillator according to claim 16, wherein tuning control means for electrically varying the capacitances of the varactors by applying a varying voltage to the control input means over a control voltage range, the control means and the varactors are configured such that at least one of the varactors exhibits variation of its capacitance in response to the control means over only a portion of the control voltage range.

18. An oscillator according to claim 16, wherein at least one of the series capacitances has a capacitance which is different from that of the or each other series capacitor.

19. An oscillator according to claim 16, wherein the control means comprise a plurality of voltage sources arranged to apply to each varactor a voltage $V_{ci}$, where $V_{ci}=V_c-V_i$, being a variable control voltage and $V_i$ being a bias voltage for each respective varactor i, the value of $V_i$ being different for the different varactors.

20. An oscillator according to claim 18, wherein the varactors, the series capacitors and the control means are configured to yield an approximately linear frequency versus control voltage response.

21. An oscillator according to claim 16, including voltage clamps across the varactors to limit their tuning ranges.

22. An oscillator according to claim 16, including a modulator circuit arm connected in parallel with the tuning circuit arms and across the inductance, the modulation circuit ann. comprising a modulation varactor and an associated series capacitor in series with the varactor, and modulation input means coupled to the junction of the modulation varactor and its associated series capacitor.

23. A variable capacitance network comprising:
a plurality of capacitance arms connected in parallel with each other between first and second terminals of the network, each capacitance arm comprising a respective varactor and an associated series capacitor in series with that varactor;
control input means coupled to the junctions between the varactors and their associated series capacitors and arranged to apply a control signal to each varactor; and
control means having a plurality of different value variable control voltage sources and a common bias voltage source whereby each variable control voltage source is independently controllable.

24. A voltage-controllable oscillator comprising:
an inductance;
a plurality of tuning circuit arms connected in parallel with each other across the inductance, each tuning circuit arm comprising a respective varactor and an associated series capacitor in series with that varactor;

control input means coupled to the junctions between the varactors and their associated series capacitors, and arranged to apply a common control signal to each varactor; and control means having a plurality of different value control voltage sources and a common bias voltage source whereby each variable control voltage source is independently controllable.

25. A tunable radio frequency (RF) circuit comprising a circuit arrangement having a variable tuning capacitance, wherein the circuit arrangement comprises a plurality of tuning varactors effectively connected in parallel, and coupled to the tuning varactors, control means arranged to apply a control signal to each varactor for electronically controlling the capacitances of the varactors, and at least inductor, the control means having a control range over which they cause the capacitance of the circuit arrangement to vary, and wherein each of the varactors has a respective fixed capacitor connected in series with it, the resulting series combination being coupled to the at least one inductor, the control means being coupled to the nodes between the varactors and their respective fixed capacitors, wherein the control means comprises a plurality of sources of different value variable control voltage sources and a common offset voltage source applied to respective ones of the varactors, whereby each variable control voltage source is independently controllable.

* * * * *